(12) United States Patent
Hagio (10) Patent No.: US 9,502,357 B2
(45) Date of Patent: Nov. 22, 2016

(54) ALIGNMENT MARK FORMATION METHOD AND SEMICONDUCTOR DEVICE

(71) Applicant: Kabushiki Kaisha Toshiba, Minato-ku (JP)

(72) Inventor: Yoshinori Hagio, Kuwana (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/799,787

(22) Filed: Jul. 15, 2015

(65) Prior Publication Data

US 2016/0268211 A1     Sep. 15, 2016

(30) Foreign Application Priority Data

Mar. 13, 2015   (JP) ................ 2015-051208

(51) Int. Cl.
| | |
|---|---|
| *H01L 23/544* | (2006.01) |
| *H01L 21/32* | (2006.01) |
| *H01L 21/02* | (2006.01) |
| *H01L 21/768* | (2006.01) |
| *H01L 23/528* | (2006.01) |

(52) U.S. Cl.
CPC ........ *H01L 23/544* (2013.01); *H01L 21/02255* (2013.01); *H01L 21/02354* (2013.01); *H01L 21/32* (2013.01); *H01L 21/768* (2013.01); *H01L 23/528* (2013.01); *H01L 2223/5442* (2013.01); *H01L 2223/54426* (2013.01)

(58) Field of Classification Search
CPC ... H01L 23/544; H01L 23/528; H01L 21/32; H01L 21/768; H01L 21/02354; H01L 21/02255

See application file for complete search history.

(56) References Cited

U.S. PATENT DOCUMENTS

| | | | | |
|---|---|---|---|---|
| 5,572,291 A | * | 11/1996 | Moriguchi | ........... G03G 7/00 399/390 |
| 6,285,455 B1 | * | 9/2001 | Shiraishi | ............. G03F 9/70 356/486 |
| 7,906,258 B2 | * | 3/2011 | Komine | ............ G03F 1/144 430/22 |
| 2009/0032979 A1 | * | 2/2009 | Nishikawa | ......... H01L 23/544 257/797 |
| 2009/0243122 A1 | * | 10/2009 | Summerfelt | ........ H01L 23/544 257/797 |

FOREIGN PATENT DOCUMENTS

JP     2009-88140     4/2009

* cited by examiner

*Primary Examiner* — Minh-Loan Tran
*Assistant Examiner* — Farid Khan
(74) *Attorney, Agent, or Firm* — Oblon, McClelland, Maier & Neustadt, L.L.P.

(57) ABSTRACT

According to one embodiment, at first, a first pattern is formed to an insulating film. Then, a first transparent film is formed on a region of the insulating film, which includes a position where the first pattern is formed. Thereafter, an opaque film which is opaque to light within a visible light region is formed on an entire surface of the insulating film. Then, a second transparent film is generated by selectively oxidizing part of the opaque film in contact with the first transparent film.

20 Claims, 7 Drawing Sheets

ALIGNMENT MARK FORMATION METHOD AND SEMICONDUCTOR DEVICE

CROSS-REFERENCE TO RELATED APPLICATIONS

This application is based upon and claims the benefit of priority from Japanese Patent Application No. 2015-051208, filed on Mar. 13, 2015; the entire contents of which are incorporated herein by reference.

FIELD

Embodiments described herein relate generally to an alignment mark formation method and a semiconductor device.

BACKGROUND

In the case of steps for manufacturing a semiconductor device, positional misalignment between patterns formed by different steps has significant influence on the operation characteristic of the device. Accordingly, techniques for measuring positional relationship of this kind with high accuracy are important to the steps for manufacturing a semiconductor device.

According to an alignment measuring technique for semiconductor devices, a mark belonging to a lower layer and a mark belonging to an upper layer are formed adjacent to each other, and the relative positional relationship between these marks is measured. In general, an optical microscope is used to observe the mark on the lower layer through a film of the upper layer. Accordingly, the film of the upper layer needs to be transparent to light having a wavelength of 300 nm to 1,000 nm (electromagnetic waves), which can be observed by the optical microscope.

However, films used in semiconductor device manufacturing processes have various properties, and thus light permeability cannot necessarily be ensured at the film of an upper layer. For example, wiring layers formed in semiconductor devices are made of a metal, such as copper (Cu) or tungsten (W), which is good in electrical conductivity. Most of the metals used in semiconductor device manufacturing processes are opaque to light.

DETAILED DESCRIPTION

In general, according to one embodiment, at first, a first pattern is formed to an insulating film. Then, a first transparent film is formed on a region of the insulating film, which includes a position where the first pattern is formed. Thereafter, an opaque film which is opaque to light within a visible light region is formed on an entire surface of the insulating film. Then, a second transparent film is generated by selectively oxidizing part of the opaque film in contact with the first transparent film.

Exemplary embodiments of an alignment mark formation method and a semiconductor device will be explained below in detail with reference to the accompanying drawings. The present invention is not limited to the following embodiments. The sectional views of a semiconductor device used in the following embodiments are schematic, and so the relationship between the thickness and width of each layer and/or the thickness ratios between respective layers may be different from actual states. Further, the film thicknesses illustrated hereinafter are mere examples, and they are not limiting.

First Embodiment

FIGS. 1A to 1E include sectional views schematically showing an example of a sequence of a semiconductor device manufacturing method, to which a first embodiment is applied. Here, FIGS. 1A to 1E show sequences of a semiconductor device manufacturing method at a semiconductor chip region 2 described later.

Figure 1A:
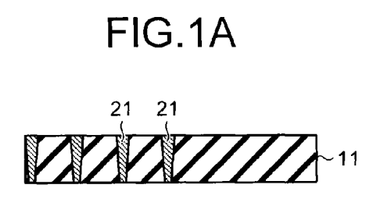
FIGS. 1A to 1E include sectional views schematically showing an example of a sequence of a semiconductor device manufacturing method, to which a first embodiment is applied.

At first, as shown in FIG. 1A, an interlayer insulating film 11, such as a silicon oxide film, is formed above a base body (not shown). For example, the base body has been prepared such that circuit elements, such as memory elements and/or transistors, are formed on a semiconductor substrate, such as a silicon substrate. Alternatively, the base body has been prepared such that wiring layers (not shown) are further formed on a semiconductor substrate including elements of this kind formed thereon.

Then, via-holes are formed in the interlayer insulating film 11 at predetermined positions, and a metal material, such as tungsten, is embedded in the via-holes, so that vias 21 are formed. Although not shown, for example, a device element or lower side wiring layer is present at the lower end of each via 21.

Figure 1B:
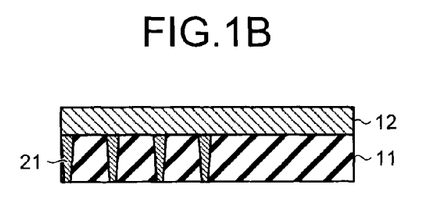
Figure 1C:
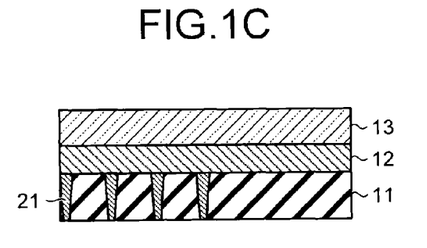
Figure 1D:
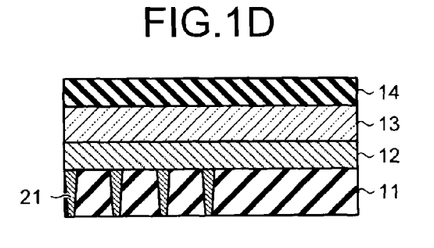

Thereafter, as shown in FIG. 1B, a wiring layer 12 is formed on the interlayer insulating film 11. The wiring layer 12 will be described later. Further, as shown in FIG. 1C, a first mask film 13 is formed on the wiring layer 12. The first mask film 13 will serve as a mask for etching the wiring layer 12. The first mask film 13 may be formed of an amorphous silicon film, for example. Further, as shown in FIG. 1D, a second mask film 14 is formed on the first mask film 13. The second mask film 14 will serve as a mask for etching the first mask film 13. The second mask film 14 may be formed of a silicon oxide film or the like, for example.

Figure 1E:
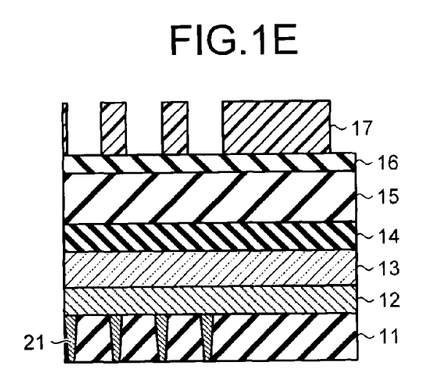

Then, as shown in FIG. 1E, a third mask film 15 and an intermediate film 16 are formed on the second mask film 14. The third mask film 15 may be formed of a carbon film formed by use of a coating method, for example. The intermediate film 16 is made of a material that provides a selective ratio relative to the third mask film 15, and may be formed of an oxide film, such as an SOG (Spin on Glass) film, for example. Further, a resist is applied onto the entire surface of the intermediate film 16, and a resist pattern 17 having a predetermined shape is formed by use of a lithography technique.

Thereafter, the intermediate film 16 and the third mask film 15 are etched, through the resist pattern 17 serving as a mask, by use of an anisotropic etching technique, such as an RIE (Reactive Ion Etching) method. Further, the second mask film 14 is etched through the third mask film 15 serving as a mask, and then the first mask film 13 is etched through the second mask film 14 serving as a mask. Then, the wiring layer 12 is etched through the first mask film 13 serving as a mask. Consequently, the wiring layer 12 is patterned to have a predetermined shape.

In the steps described above, for example, when the resist pattern 17 is formed, positioning is performed between the resist pattern 17 and an alignment mark formed at a region (not shown) of the interlayer insulating film 11. However, since the wiring layer 12 is made of a metal material, such as W, and is thereby opaque, it is difficult to perform the positioning with high accuracy. Accordingly, hereinafter, an explanation will be given of an alignment mark formation method and a semiconductor device, which make it possible to perform positioning by use of an alignment mark through the wiring layer 12 formed of an opaque metal film.

Figure 2A:
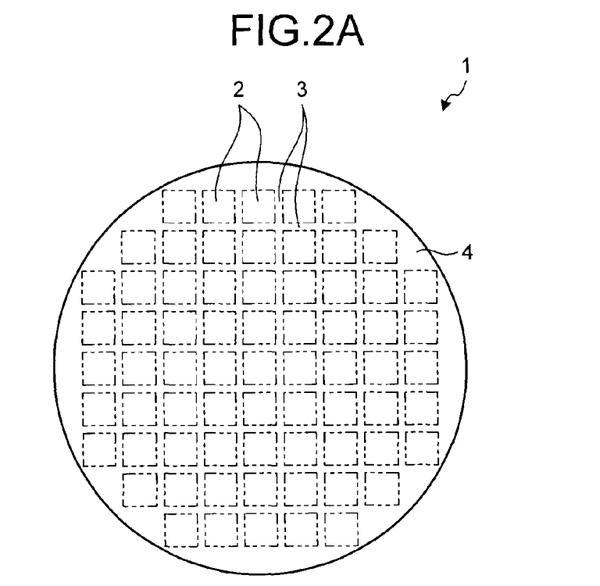
FIGS. 2A and 2B include top views of a semiconductor device according to the first embodiment.
Figure 2B:
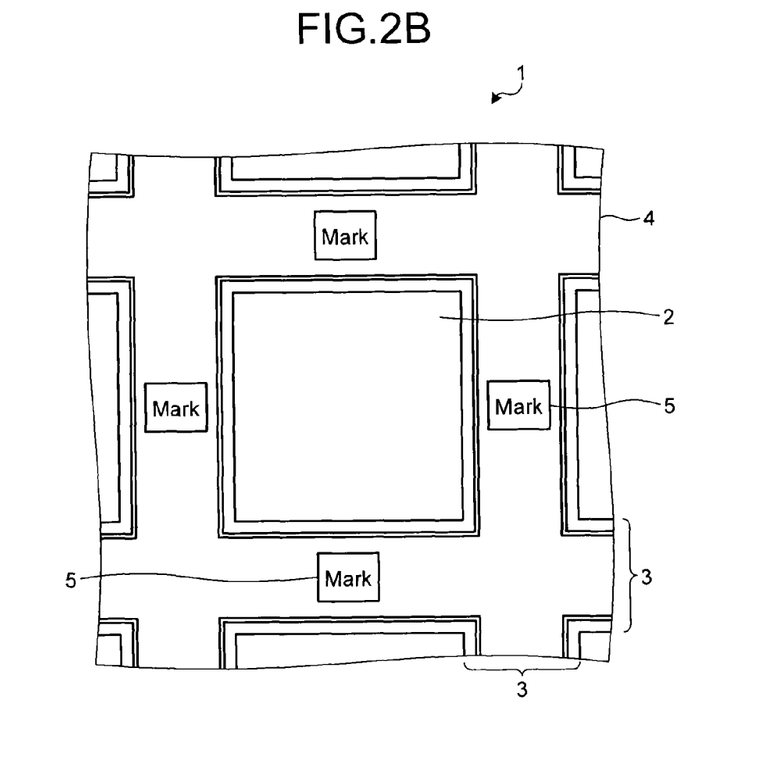

FIGS. 2A and 2B include top views of a semiconductor device according to the first embodiment. FIG. 2A is a top view showing the entire substrate, and FIG. 2B is an enlarged partial view of FIG. 2A. The semiconductor device 1 shown in FIGS. 2A and 2B includes a plurality of semiconductor chip regions 2 and scribe lines 3 arranged on a substrate (wafer) 4. The scribe lines 3 are respectively present between the semiconductor chip regions 2. The scribe lines 3 are provided with mark regions, and alignment marks 5 are respectively arranged on the mark regions. The alignment marks 5 are arranged to be used for positioning in a lithography step and/or for measurement of a positional misalignment amount of an upper layer relative to a lower layer. Here, the lithography is such a technique that applies a resist onto a processing object, then performs positioning by use of alignment marks on the processing object, and then performs patterning to the resist. This lithography may be exemplified by light lithography, EUV (Extreme Ultra-Violet) light lithography, or nano-imprint lithography.

When the substrate 4 is cut along the scribe lines 3, a plurality of semiconductor chip regions 2 are diced into semiconductor chips. Each semiconductor chip may be exemplified by a memory chip including a NAND type flash memory, for example.

Figure 3A:
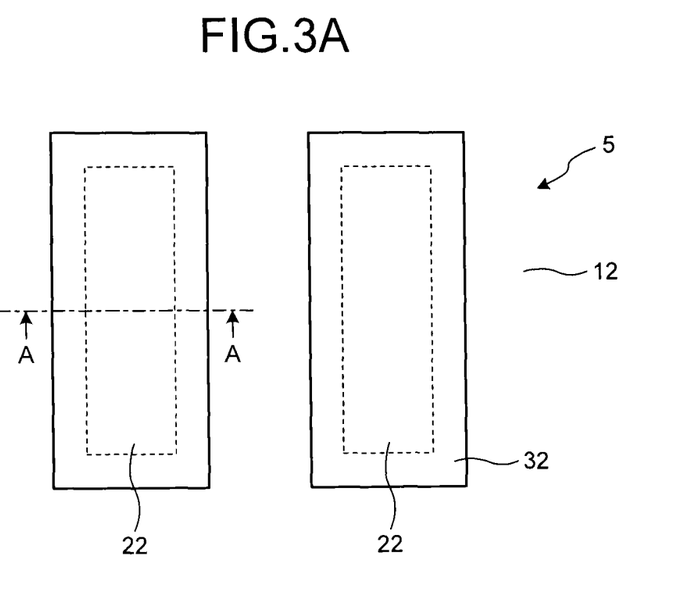
FIGS. 3A and 3B include views schematically showing an example of a structure of an alignment mark according to the first embodiment.
Figure 3B:
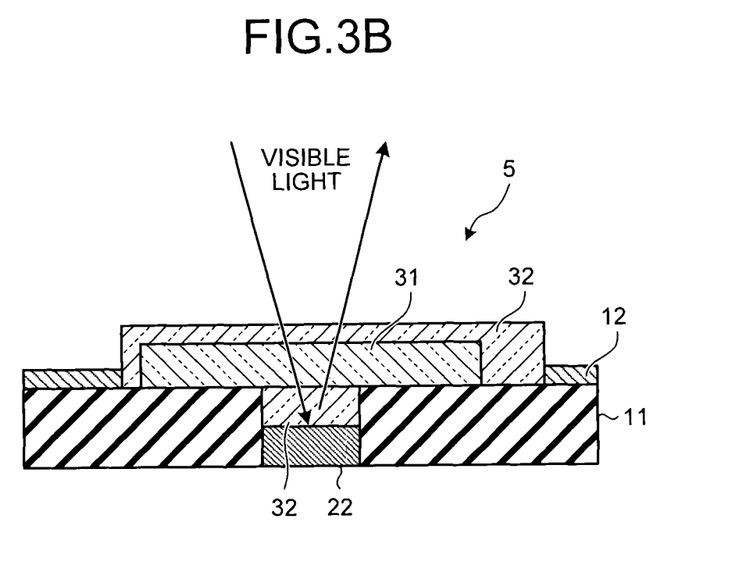

FIGS. 3A and 3B include views schematically showing an example of a structure of each alignment mark according to the first embodiment. FIG. 3A illustrates a top view of the alignment mark, and FIG. 3B illustrates a sectional view taken along a line A-A in FIG. 3A. In this example, the alignment mark 5 includes metal patterns 22, each of which is a first pattern embedded in the interlayer insulating film 11. Each metal pattern 22 is made of the same material as that of the vias 21 shown in FIG. 1A. In this example, with reference to the metal patterns 22, positioning is performed in the lithography step shown in FIG. 1E, for example.

In the example shown in FIG. 3A, the alignment mark 5 has a configuration in which the linear metal patterns 22 extend in a predetermined direction and are arranged in parallel with each other. A transparent oxygen-containing film 31 is arranged as a first transparent film at a region including the formation position of each metal pattern 22.

The transparent oxygen-containing film 31 is made of a material that is transparent and has a property of easily releasing oxygen by annealing. The transparent oxygen-containing film 31 may be exemplified by zinc oxide (ZnO), indium oxide ($In_2O_3$), or calcium hydroxide ($Ca(OH)_2$), for example.

Further, a transparent oxide film 32 is arranged as a second transparent film, which has been formed by oxidization of part of the wiring layer 12, on the upper surface and side surface of the transparent oxygen-containing film 31. Further, a transparent oxide film 32, which has been formed by oxidization of part of the metal pattern 22, is arranged at the boundary between the transparent oxygen-containing film 31 and the metal pattern 22.

The wiring layer 12 formed of an opaque film is arranged on the regions other than the regions where the transparent oxygen-containing film 31 and the transparent oxide films 32 are arranged. This wiring layer 12 is arranged to be used as a wiring line in each semiconductor chip region 2. The wiring layer 12 may be made of a metal material such that its original state is opaque to light within the visible light region but its oxide is transparent to light within the visible light region. For example, tungsten, zinc (Zn), indium (In), titanium (Ti), aluminum (Al), or silicon (Si) may be used as such a material. Here, in this specification, the term "opaque" means a state where the transmittance to light within the visible light region is not higher than a predetermined value (for example, 10%).

Figure 4:
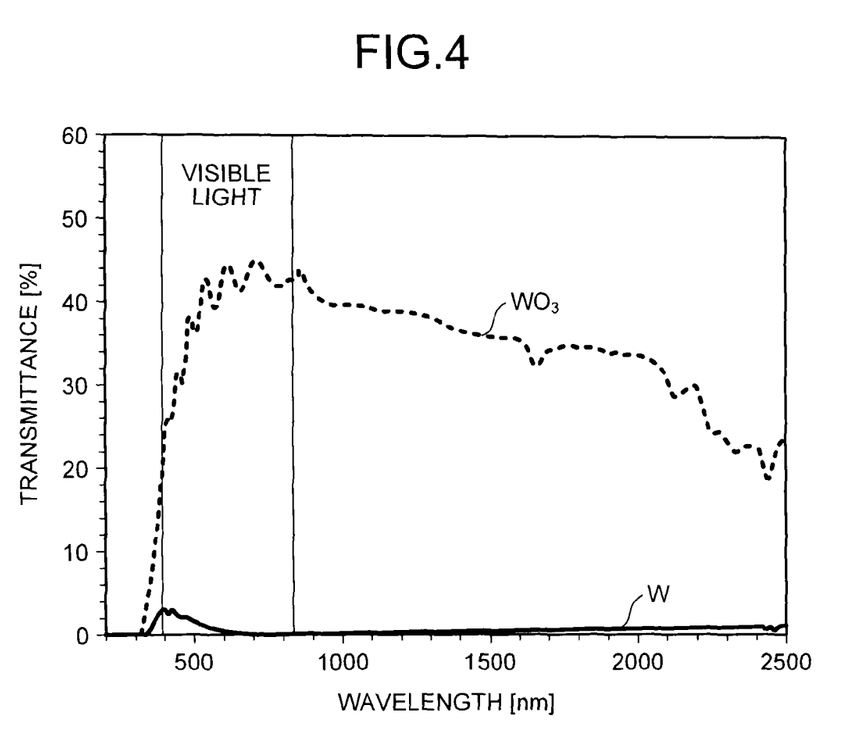
FIG. 4 is a view showing an example of transmittance of tungsten in a metal state and an oxidized state.

FIG. 4 is a view showing an example of transmittance of tungsten in a metal state and an oxidized state. In FIG. 4, the horizontal axis denotes the wavelength of light (electromagnetic waves), and the vertical axis denotes the light transmittance of tungsten in the metal state or oxidized state. As shown in FIG. 4, tungsten in the metal state essentially does not transmit light within the visible light region. On the other hand, tungsten in the oxidized state (tungsten trioxide: $WO_3$) has a transmittance of 30% to 45% to light within the visible light region. Accordingly, the transparent oxygen-containing film 31 is arranged above the alignment mark 5 on the lower layer, so that the alignment mark 5 on the lower layer can be optically observed. Here, in an example shown in FIG. 4, W is used, but this is also true even if another metal element (such as zinc, indium, titanium, aluminum, or silicon) is used.

Figure 5A:
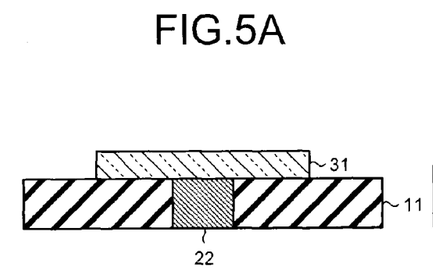
FIGS. 5A to 5C include sectional views schematically showing an example of a sequence of an alignment mark formation method according to the first embodiment.
Figure 5B:
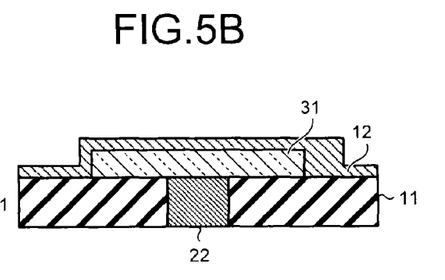
Figure 5C:
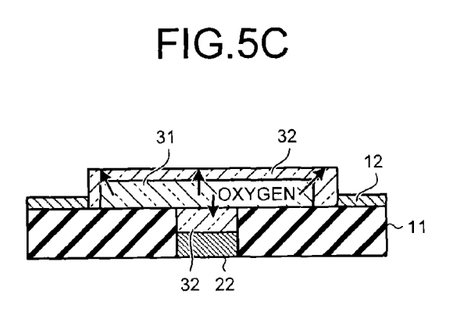

Next, an explanation will be given of a formation method of the alignment mark 5 described above. FIGS. 5A to 5C include sectional views schematically showing an example of a sequence of an alignment mark formation method according to the first embodiment. FIGS. 5A to 5C illustrate sectional views corresponding to the line A-A sectional view shown in FIG. 3A.

At first, as shown in FIG. 1A, in the semiconductor chip regions 2, vias 21 are embedded in the interlayer insulating film 11. At this time, in the mark regions on the scribe lines 3, metal patterns 22 are embedded in the interlayer insulating film 11. Thereafter, as shown in FIG. 5A, transparent oxygen-containing films 31 are respectively formed on predetermined regions of the lower layer including the alignment marks 5 above the scribe lines 3. For example, the transparent oxygen-containing films 31 may be formed, as follows: A transparent oxygen-containing film 31 is formed on the interlayer insulating film 11 over the semiconductor chip regions 2 and the scribe lines 3, and is patterned by use of a lithography technique and an etching technique, so that transparent oxygen-containing films 31 are left only at predetermined regions including the alignment marks 5. Alternatively, the transparent oxygen-containing films 31 may be formed, as follows: A solvent containing fine particles of the component material of the transparent oxygen-containing films 31 is dropped on predetermined regions including the alignment marks 5 above the scribe lines 3 by use of an ink-jet method, and is subjected to a heat process at a low temperature. Here, the transparent oxygen-containing films 31 are not formed above the semiconductor chip regions 2.

Each transparent oxygen-containing film 31 is made of a material that has light permeability as it is, and contains a large amount of oxygen. The transparent oxygen-containing film 31 may be made of zinc oxide, indium oxide, or calcium hydroxide, for example. Further, the transparent oxygen-containing film 31 has a thickness such that the transparent oxygen-containing film 31 can oxidize part of a wiring layer 12 formed on the transparent oxygen-containing film 31 later. The thickness of the transparent oxygen-containing film 31 may be set to 5 to 100 nm, for example.

Then, as shown in FIG. 5B, the wiring layer 12 is formed on the interlayer insulating film 11 including the transparent oxygen-containing films 31 formed thereon. The wiring layer 12 may be made of tungsten, zinc, indium, titanium, aluminum, or silicon, for example. The thickness of the wiring layer 12 may be set to 20 nm, for example.

This step corresponds to the step shown in FIG. 1B. In a case where the wiring layer 12 is formed by use of a sputtering method, metal particles emitted from the sputtering target radially scatter outward from a position near the center of the substrate 4. If stepped portions are present on the substrate 4 in a direction perpendicular to the scattering direction of the metal particles, metal particles deposited on stepped portions having a convex shape are increased, and metal particles deposited on stepped portions having a concave shape are reduced. Accordingly, metal films deposited on stepped portions having a convex shape form an asymmetric shape relative to a direction extending outward from the center of the substrate 4, as the case may be.

Then, as shown in FIG. 5C, an annealing process is performed at a temperature of 400° C. or higher in an atmosphere containing no oxygen. Consequently, part of the wiring layer 12 in contact with each transparent oxygen-containing film 31 is oxidized by oxygen supplied from the transparent oxygen-containing film 31, and thereby becomes a transparent oxide film 32. In a case where the wiring layer 12 is made of tungsten, a heat process is performed at a temperature of 700° C. for 1 minute in a vacuum atmosphere, for example. Consequently, tungsten above the alignment mark 5 is oxidized by oxygen released from the transparent oxygen-containing film 31, and thereby becomes tungsten trioxide. As shown in FIG. 4, tungsten trioxide expresses permeability to light within the visible light region. Here, the heat process atmosphere may be any atmosphere containing no oxygen, and it may be an atmosphere formed of an inactive gas, such as argon (Ar), helium (He), or nitrogen ($N_2$) gas. Further, in the case of tungsten, zinc, indium, titanium, aluminum, or silicon, described above, it can be oxidized by oxygen released from the transparent oxygen-containing film 31 at a temperature of 400° C. or higher.

Further, during this annealing process, part of each metal pattern 22 in contact with the transparent oxygen-containing film 31 is also oxidized by oxygen supplied from the transparent oxygen-containing film 31, and thereby becomes a transparent oxide film 32.

Here, during this annealing process, part of the wiring layer 12 out of contact with each transparent oxygen-containing film 31 is not oxidized, because it is not supplied with oxygen. However, due to this annealing process, the particle size of the metal material forming the wiring layer 12 is enlarged. The wiring layer 12 having a larger particle size improves its electrical conductivity, as compared with a case excluding the annealing process.

Further, the annealing process may be performed by use of a method for locally heating the formation position of each alignment mark 5, such as a laser annealing method. The laser annealing method is a method of irradiating only the formation position of each alignment mark 5 with laser, and oxidizing the wiring layer 12 by oxygen released from the transparent oxygen-containing film 31 to generate the transparent oxide film 32. In this case, heat is not applied to the portions other than the portions irradiated with laser. Accordingly, the annealing process is preferably performed by use of the laser annealing method in the case of a semiconductor device having a structure in which device element characteristics will be deteriorated if the entirety of the substrate 4 is heated at a temperature of 400° C. or higher.

Here, the alignment mark 5 shown in FIG. 3A is configured to measure positional misalignment in a direction perpendicular to the extending direction of the metal patterns 22. Accordingly, in order to measure positional misalignment in the extending direction of the metal patterns 22 in the state shown in FIG. 3A, another mark region is provided with an alignment mark 5 including metal patterns 22 having an extending direction rotated by 90° from the state shown in FIG. 3A.

Figure 6:
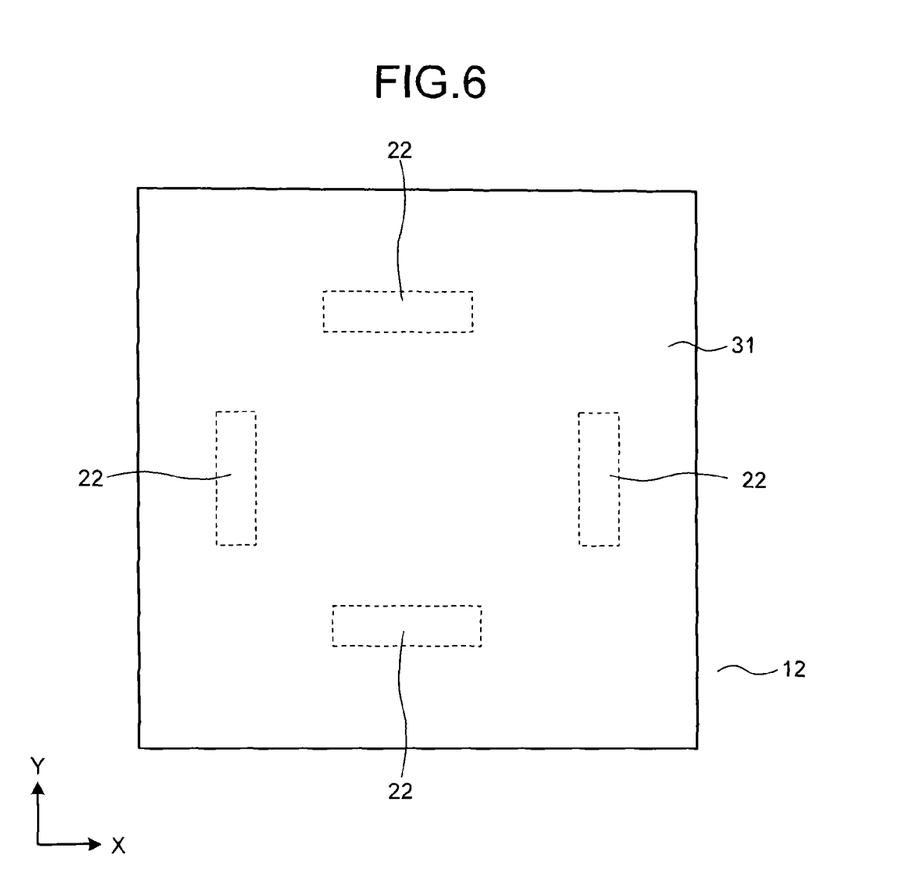
FIG. 6 is a top view schematically showing another example of a structure of an alignment mark according to the first embodiment.

Further, there may be arranged a single alignment mark 5 designed to measure positional misalignment in two directions perpendicular to each other. FIG. 6 is a top view schematically showing another example of a structure of an alignment mark according to the first embodiment. As shown in FIG. 6, a single mark region may be provided with two metal patterns 22 having an extending direction in an X-direction and two metal patterns 22 having an extending direction in a Y-direction. If the four metal patterns 22 are prepared as shown here, positional misalignment can be measured in each of the X-direction and the Y-direction.

Further, FIG. 3A illustrates a case where the transparent oxygen-containing film 31 is provided to each of the metal patterns 22, but a transparent oxygen-containing film 31 may be provided to entirely cover each alignment mark 5 (mark region) as shown in FIG. 6. In other words, a plurality of metal patterns 22 may be covered with a single transparent oxygen-containing film 31. Further, a transparent oxygen-containing film 31 may be provided over the entire surface of the scribe lines 3.

Furthermore, FIG. 2B illustrates a case where four alignment marks 5 are arranged around each semiconductor chip region 2, for example, but it suffices if one or more alignment marks 5 are arranged relative to each semiconductor chip region 2. Accordingly, the number of arranged alignment marks 5 is not limited to a specific one.

In the first embodiment, the transparent oxygen-containing films 31 are respectively provided on the alignment marks 5, then the wiring layer 12 is formed on the entire surface of the interlayer insulating film 11, and then the annealing process is performed. Consequently, the portions of the wiring layer 12 on the alignment marks 5 are selectively oxidized, and thereby become the transparent oxide films 32 having light permeability, while the other portions of the wiring layer 12 on the other regions (semiconductor chip regions 2) are not transformed from the metal state. Thus, there is provided an effect of being able to observe the alignment marks 5 (overlay marks) of via-layers and thereby to perform overlay with high accuracy in the photo-lithography process for patterning the wiring layer 12. Further, since the wiring layer 12 is not oxidized in the regions other than the mark regions, there is also provided an effect of being able to prevent a decrease in the electrical conductivity of the wiring layer 12 required in the semiconductor chip regions 2 where device patterns are formed. As described above, it is possible to improve the overlay accuracy in performing overlay through a metal wiring layer opaque to light within the visible light region, and thereby to solve problems concerning the overlay in miniaturizing a semiconductor device.

Second Embodiment

In the first embodiment, there has been illustrated a case where the upper surface of each alignment mark is flush with the upper surface of the interlayer insulating film. In the second embodiment, an explanation will be given of a semiconductor device and an alignment mark formation method in case where the upper surface of each alignment mark protrudes from the upper surface of the interlayer insulating film.

Figure 7:
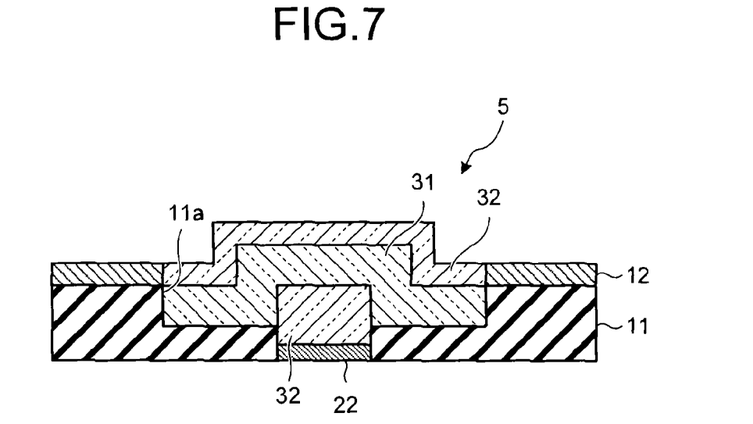
FIG. 7 is a sectional view schematically showing an example of a structure of an alignment mark according to a second embodiment.

FIG. 7 is a sectional view schematically showing an example of a structure of an alignment mark according to the second embodiment. FIG. 7 corresponds to the line A-A sectional view shown in FIG. 3A. As shown in FIG. 7, a recessed portion 11a is formed in the interlayer insulating film 11 at the region for arranging each alignment mark 5. A transparent oxygen-containing film 31 is provided in a state of filling this recessed portion 11a. Further, a transparent oxide film 32 is arranged on the upper surface of the transparent oxygen-containing film 31, and another transparent oxide film 32 is arranged at the boundary between the transparent oxygen-containing film 31 and a metal pattern 22. A stacked body composed of the metal pattern 22 and the transparent oxide film 32 formed by oxidization of part of the metal pattern 22 is present inside the recessed portion 11a and protrudes from the bottom of the recessed portion 11a. The constituent elements corresponding to those of the first embodiment are denoted by the same reference symbols, and their description will be omitted.

Next, an explanation will be given of a formation method of the alignment mark described above. FIGS. 8A to 8D include sectional views schematically showing an example of a sequence of an alignment mark formation method according to the second embodiment. FIGS. 8A to 8D illustrate sectional views corresponding to the line A-A sectional view shown in FIG. 3A.

Figure 8A:
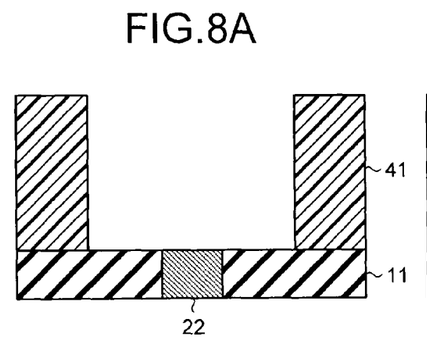
FIGS. 8A to 8D include sectional views schematically showing an example of a sequence of an alignment mark formation method according to the second embodiment.

At first, as shown in FIG. 1A, in the semiconductor chip regions 2, vias 21 are embedded in the interlayer insulating film 11. At this time, in the mark regions on the scribe lines 3, metal patterns 22 are embedded in the interlayer insulating film 11. Thereafter, as shown in FIG. 8A, a resist is applied onto the interlayer insulating film 11. A resist pattern 41, which includes openings at regions including the regions for arranging the alignment marks 5, is formed by use of a lithography technique.

Figure 8B:
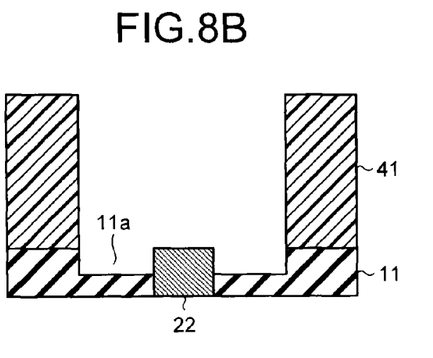

Then, as shown in FIG. 8B, the interlayer insulating film 11 is etched, through the resist pattern 41 serving as a mask, by use of an anisotropic etching technique, such as an RIE method. At this time, the etching is performed under conditions by which the interlayer insulating film 11 is etched in preference to the metal patterns 22. Consequently, recessed portions 11a are formed in the interlayer insulating film 11. Each recessed portion 11a is set to have a depth of 5 to 20 nm, for example.

Figure 8C:
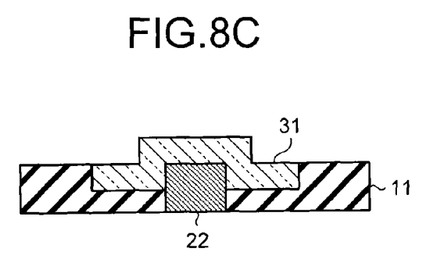

Thereafter, as shown in FIG. 8C, the resist pattern 41 is removed, and transparent oxygen-containing films 31 are formed such that they respectively fill the recessed portions 11a of the interlayer insulating film 11. The transparent oxygen-containing films 31 may be formed by use of the same method as that explained in the first embodiment.

Figure 8D:
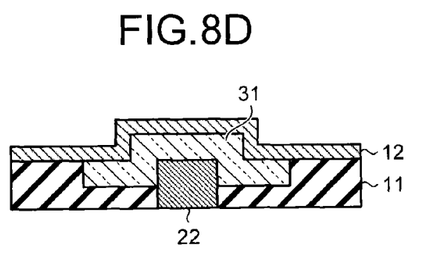

Thereafter, as shown in FIG. 8D, a wiring layer 12 is formed on the interlayer insulating film 11 including the transparent oxygen-containing films 31 embedded therein. Then, an annealing process is performed at a temperature of 400° C. or higher in an atmosphere containing no oxygen, or an annealing process is performed, by use of a laser annealing method or the like, selectively to the regions where the metal patterns 22 are formed. Consequently, the alignment marks 5 each having the structure shown in FIG. 7 are obtained.

The second embodiment can provide the same effects as those of the first embodiment.

In the embodiments described above, the alignment marks 5 are formed on the scribe lines 3, but the alignment marks 5 may be arranged on mark regions provided within the semiconductor chip regions 2 at places where device elements are not formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An alignment mark formation method comprising:
   forming a first pattern to an insulating film;
   forming a first transparent film on a region of the insulating film, which includes a position where the first pattern is formed;
   forming an opaque film, which is opaque to light within a visible light region, on an entire surface of the insulating film; and
   generating a second transparent film by selectively oxidizing part of the opaque film in contact with the first transparent film.

2. The alignment mark formation method according to claim 1, wherein the first transparent film is made of a material containing oxygen.

3. The alignment mark formation method according to claim 2, wherein the first transparent film is made of a material that releases oxygen by a heat process.

4. The alignment mark formation method according to claim 2, wherein the first transparent film is made of at least one material selected from the group consisting of zinc oxide, indium oxide, and calcium hydroxide.

5. The alignment mark formation method according to claim 1, wherein the opaque film is made of a material that increases its transmittance by oxidization.

6. The alignment mark formation method according to claim 5, wherein the opaque film is made of at least one material selected from the group consisting of tungsten, zinc, indium, titanium, aluminum, and silicon.

7. The alignment mark formation method according to claim 1, wherein, in the generating of a second transparent film, at least part of the opaque film in contact with the first transparent film is annealed at a temperature of 400° C. or higher.

8. The alignment mark formation method according to claim 7, wherein, in the generating of a second transparent film, the annealing is performed in an atmosphere containing no oxygen.

9. The alignment mark formation method according to claim 8, wherein the atmosphere containing no oxygen is an inactive gas atmosphere or vacuum atmosphere.

10. The alignment mark formation method according to claim 1, wherein, in the generating of a second transparent film, the position where the first pattern is formed is locally heated.

11. The alignment mark formation method according to claim 10, wherein a laser annealing method is used for the locally heating the position where the first pattern is formed.

12. A semiconductor device including a first region provided with device elements and a second region provided with no device elements, such that the first region and the second region are arranged above the substrate, and the second region is provided with an alignment mark, the semiconductor device comprising:
   a wiring layer arranged on an insulating film in the first region,
   wherein the alignment mark includes
      a metal pattern having a predetermined shape and embedded in the insulating film within the second region,
      a first transparent film arranged on a region of the insulating film, which includes the metal pattern, and
      a second transparent film covering the first transparent film, and
   the second transparent film is oxide of a material that forms the wiring layer.

13. The semiconductor device according to claim 12, wherein the first transparent film is made of a material containing oxygen.

14. The semiconductor device according to claim 13, wherein the first transparent film is made of at least one material selected from the group consisting of zinc oxide, indium oxide, and calcium hydroxide.

15. The semiconductor device according to claim 12, wherein the wiring layer is made of a material that increases its transmittance by oxidization.

16. The semiconductor device according to claim 15, wherein the wiring layer is made of at least one material selected from the group consisting of tungsten, zinc, indium, titanium, aluminum, and silicon.

17. The semiconductor device according to claim 12, wherein the metal pattern includes a pair of linear patterns.

18. The semiconductor device according to claim 12, wherein the metal pattern includes a pair of first linear patterns extending in a first direction and a pair of second linear patterns extending in a second direction perpendicular to the first direction.

19. The semiconductor device according to claim 12, wherein an upper surface of the insulating film is flush with an upper surface of the metal pattern.

20. The semiconductor device according to claim 12, wherein an upper surface of the metal pattern protrudes from an upper surface of the insulating film.

* * * * *